United States Patent
Ueda et al.

(10) Patent No.: US 10,490,422 B2
(45) Date of Patent: Nov. 26, 2019

(54) MANUFACTURING METHOD FOR SEMICONDUCTOR DEVICE

(71) Applicant: Mitsubishi Electric Corporation, Tokyo (JP)

(72) Inventors: Tetsuya Ueda, Tokyo (JP); Hiroshi Yoshida, Tokyo (JP); Seiji Oka, Tokyo (JP); Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/738,836

(22) PCT Filed: Oct. 6, 2015

(86) PCT No.: PCT/JP2015/078293
§ 371 (c)(1),
(2) Date: Dec. 21, 2017

(87) PCT Pub. No.: WO2017/060970
PCT Pub. Date: Apr. 13, 2017

(65) Prior Publication Data
US 2018/0174864 A1    Jun. 21, 2018

(51) Int. Cl.
*H01L 21/56* (2006.01)
*H01L 23/48* (2006.01)
(Continued)

(52) U.S. Cl.
CPC ...... *H01L 21/565* (2013.01); *B29C 45/14065* (2013.01); *B29C 45/14639* (2013.01); *H01L 21/56* (2013.01); *H01L 21/67126* (2013.01); *H01L 23/48* (2013.01); *H01L 23/49541* (2013.01); *H01L 23/49575* (2013.01); *H01L 25/0655* (2013.01); *B29C 2045/14163* (2013.01); *B29L 2031/3406* (2013.01); *H01L 23/3121* (2013.01); *H01L 24/48* (2013.01);
(Continued)

(58) Field of Classification Search
None
See application file for complete search history.

(56) References Cited

FOREIGN PATENT DOCUMENTS

EP    0 959 494 A1    11/1999
EP    2 816 599 A2    12/2014
(Continued)

OTHER PUBLICATIONS

International Preliminary Report on Patentability issued in corresponding International Patent Application No. PCT/JP2015/078293; dated Apr. 19, 2018; with English translation.
(Continued)

*Primary Examiner* — Telly D Green
(74) *Attorney, Agent, or Firm* — Studebaker & Brackett PC

(57) ABSTRACT

An object is to provide a technology that reduces the number of components and that is capable of suppressing the cost. A structure including semiconductor elements, a plurality of electrode terminals, and a dam bar for connecting the plurality of electrode terminals is prepared, and a part of the structure including a part of the plurality of electrode terminals and the dam bar is arranged in the terminal hole. Further, the part of the structure is clamped by a movable clamp inside the terminal hole, and at least a portion of the movable clamp is fitted into the terminal hole, and then a resin is injected into an internal space of a pair of molds.

16 Claims, 17 Drawing Sheets

(51) Int. Cl.
 *B29C 45/14*  (2006.01)
 *H01L 21/67*  (2006.01)
 *H01L 23/495*  (2006.01)
 *H01L 25/065*  (2006.01)
 *B29L 31/34*  (2006.01)
 *H01L 23/00*  (2006.01)
 *H01L 23/31*  (2006.01)

(52) U.S. Cl.
 CPC ............... *H01L 2224/45124* (2013.01); *H01L 2224/48091* (2013.01); *H01L 2224/48101* (2013.01); *H01L 2224/48106* (2013.01); *H01L 2224/48137* (2013.01); *H01L 2224/48245* (2013.01); *H01L 2924/181* (2013.01)

(56) References Cited

FOREIGN PATENT DOCUMENTS

| | | |
|---|---|---|
| JP | 63-302545 A | 12/1988 |
| JP | 01-110446 U | 7/1989 |
| JP | 01-157445 U | 10/1989 |
| JP | 10-116962 A | 5/1998 |
| JP | 2003-017643 A | 1/2003 |
| JP | 2010-182879 A | 8/2010 |
| JP | 5012772 B2 | 8/2012 |
| KR | 2000-0068262 A | 11/2000 |

OTHER PUBLICATIONS

An Office Action; "Notification of Reasons for Refusal," by the Japanese Patent Office dated Mar. 13, 2018, which corresponds to Japanese Patent Application No. 2017-544098 and is related to U.S. Appl. No. 15/738,836; with English Translation.

International Search Report issued in PCT/JP2015/078293; dated Dec. 22, 2015.

An Office Action mailed by the Korean Intellectual Property Office dated Sep. 3, 2019, which corresponds to Korean Patent Application No. 10-2018-7003069 and is related to U.S. Appl. No. 15/738,836; with English translation.

MANUFACTURING METHOD FOR SEMICONDUCTOR DEVICE

TECHNICAL FIELD

The present invention relates to a method of manufacturing a semiconductor device of a resin-sealing type.

BACKGROUND ART

In a high breakdown-voltage semiconductor device such as a power module, from the viewpoint of the manufacturing cost, productivity, or the like, a transfer molding technology in which semiconductor elements and electrode terminals are sealed with a resin package has been more used. Further, from the viewpoint of downsizing, such a configuration that the electrode terminals are made to extend in a height direction of the package instead of being made to extend in a lateral direction of the package has been more employed (Patent Document 1, for example).

PRIOR ART DOCUMENTS

Patent Documents

Patent Document 1: Japanese Patent No. 5012772

SUMMARY

Problem to be Solved by the Invention

However, in the technology of Patent Document 1, a plurality of rod-shaped electrode terminals need to be soldered to the semiconductor elements or the like individually, thus increasing the number of components, which causes a problem that work time is extended. Further, in the technology of Patent Document 1, in order to prevent distal end portions of the electrode terminals from being sealed with a resin, sealing is performed after fitting cylindrical resin members (sleeves) to the distal end portions. For this reason, the cylindrical resin members are needed, which leads to a problem that cost of materials or the like is required.

In view of the above, the present invention is made in consideration of the problems as described above, and has an object to provide a technology that reduces the number of components and that is capable of suppressing the cost.

Means to Solve the Problem

A method of manufacturing a semiconductor device according to the present invention includes the steps of: (a) preparing a structure including a semiconductor element, a plurality of electrode terminals that are electrically coupled to the semiconductor element and are arrayed, and a dam bar for connecting the plurality of electrode terminals; (b) arranging a part of the structure including a part of the plurality of electrode terminals and the dam bar into a terminal hole being formed in a pair of molds and communicating with an internal space that is capable of being enclosed by the pair of molds, and accommodating a remaining part other than the part of the structure in the internal space of the pair of molds; (c) clamping the part of the structure with a movable clamp inside the terminal hole, and fitting at least a portion of the movable clamp into the terminal hole; and (d) injecting a resin into the internal space of the pair of molds after the step (c).

Effects of the Invention

According to the present invention, the structure including the semiconductor element, the plurality of electrode terminals, and the dam bar for connecting the plurality of electrode terminals is prepared, the part of the structure is clamped by the movable clamp inside the terminal hole formed in the pair of molds, at least a portion of the movable clamp is fitted into the terminal hole, and then the resin is injected into the internal space of the pair of molds. With this, the number of components is reduced, and the cost can be suppressed.

The object, features, modes, and advantages of the present invention are made more obvious with the following detailed description and the attached drawings.

DESCRIPTION OF EMBODIMENTS

First Embodiment

Figure 1:
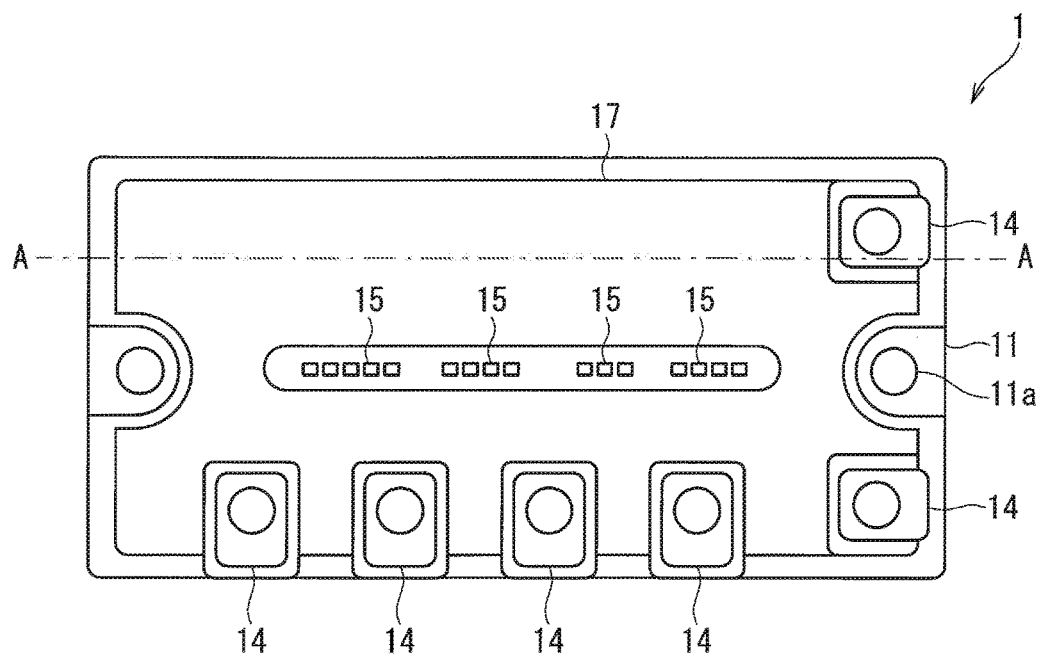
FIG. 1 is a plan view for illustrating configuration of a semiconductor device according to a first embodiment.
Figure 2:
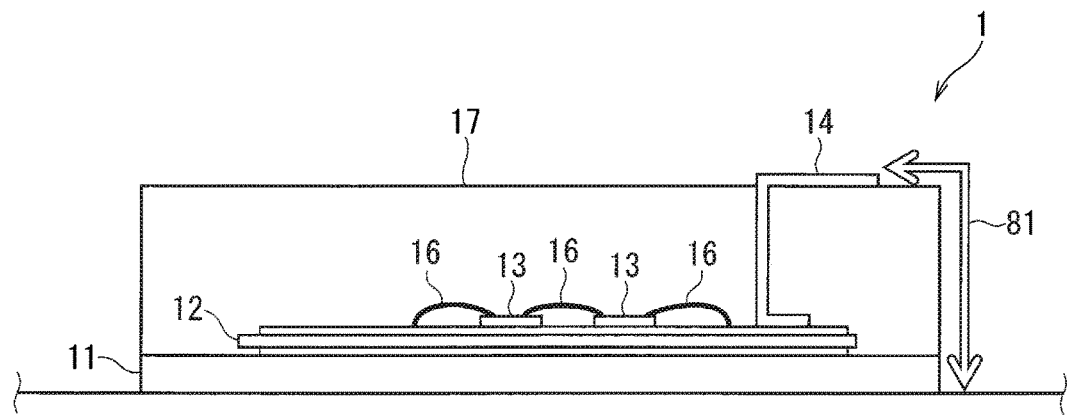
FIG. 2 is a sectional view taken along the line A-A of FIG. 1 for illustrating the configuration of the semiconductor device according to the first embodiment.

FIG. 1 is a plan view for illustrating configuration of a semiconductor device according to a first embodiment of the present invention, and FIG. 2 is a sectional view taken along the line A-A of FIG. 1.

A semiconductor device 1 of FIG. 1 includes a base plate 11 having mounting holes 11a formed in end portions thereof, a ceramic substrate 12 disposed on the base plate 11, semiconductor elements 13 and main terminals 14 disposed on the ceramic substrate 12, and control terminals 15 disposed on the ceramic substrate 12 or the semiconductor elements 13. The semiconductor elements 13 are used as components such as a switching element and a memory, for example.

The semiconductor device 1 further includes, in addition to the above-mentioned components, aluminum wires 16 for coupling the semiconductor elements 13 and electrodes (not shown) provided on the ceramic substrate 12, and a transfer mold resin 17 for covering and sealing the components of the semiconductor device 1. As is understood from FIG. 1 and FIG. 2, the main terminals 14 and the control terminals 15 extend in a height direction of the semiconductor device 1, and a portion of the main terminals 14 and a portion of the control terminals 15 are exposed from an upper surface of the transfer mold resin 17 being a package.

Note that, in FIG. 2, there is an illustration of a creepage distance (insulation distance) 81 between terminals of the semiconductor device 1 and a system (not shown) in a case where the semiconductor device 1 is mounted to the system. When a power module (semiconductor device 1) is incorporated into the system, it is preferred that the creepage distance 81 be long. Note that, description of lengthening the creepage distance 81 is given in a third embodiment.

An example of a method of manufacturing the semiconductor device 1 is described. The semiconductor elements 13 are attached to the ceramic substrate 12 through die bonding with use of solder or the like (not shown), and the electrodes of the semiconductor elements 13 and the electrodes on the ceramic substrate 12 are electrically coupled with the aluminum wires 16 or the like. Further, the ceramic substrate 12 having the semiconductor elements 13 mounted thereon is mounted onto the base plate 11 with solder or the like (not shown). Then, after joining the main terminals 14, the control terminals 15, and the like and sealing such components with the transfer mold resin 17, the main terminals 14 and the control terminals 15 are bent as needed, thereby completing the semiconductor device 1.

Figure 3:
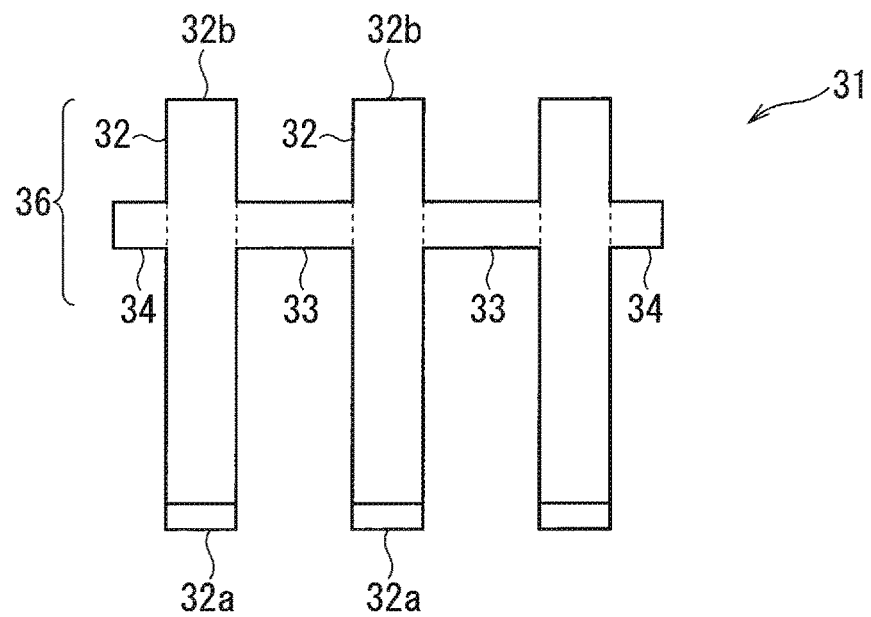
FIG. 3 is a front view for illustrating configuration of an electrode terminal frame according to the first embodiment.
Figure 4:
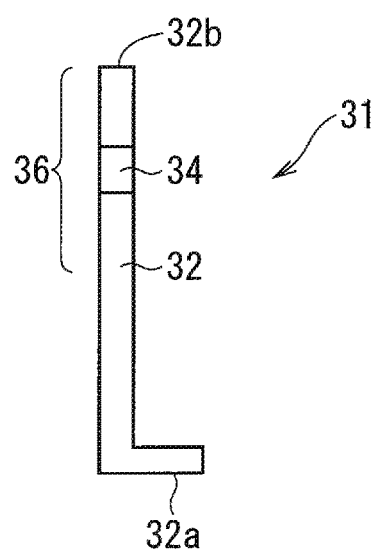
FIG. 4 is a side view for illustrating the configuration of the electrode terminal frame according to the first embodiment.

Next, a sealing step of performing sealing with the transfer mold resin 17 is described in detail. Note that, prior to the sealing step, a structure (intermediate of the semiconductor device 1) including the above-mentioned semiconductor elements 13 and an electrode terminal frame 31 illustrated in FIG. 3 and FIG. 4 is prepared. Note that, in FIG. 3 and the subsequent drawings, for the sake of convenience, illustration of parts of the structure other than the electrode terminal frame 31 is omitted. Note that, in this embodiment, the structure also includes the above-mentioned ceramic substrate 12 and the like in addition to the semiconductor elements 13 and the electrode terminal frame 31, but the ceramic substrate 12 and the like are not essential.

Next, with use of FIG. 3 and FIG. 4, configuration of the electrode terminal frame 31 is described in detail. FIG. 3 is a front view for illustrating configuration of the electrode terminal frame 31 of the structure, and FIG. 4 is a side view for illustrating the configuration of the electrode terminal frame 31. The electrode terminal frame 31 includes a plurality of electrode terminals 32, dam bars 33, and protruding portions 34. Note that, in FIG. 3 and the drawings that are similar thereto, broken lines for distinguishing the plurality of electrode terminals 32, the dam bars 33, and the protruding portions 34 are given, but the broken lines are given merely for the sake of convenience as a reference.

The plurality of electrode terminals 32 are terminals electrically coupled to the semiconductor elements 13, and are arrayed in alignment, for example. Through the sealing step, designing is made such that each electrode terminal 32 on one end 32a side is covered by the transfer mold resin 17 and that each electrode terminal 32 on another end 32b side is not covered by the transfer mold resin 17. Note that, in this first embodiment, the plurality of electrode terminals 32 are applied to the plurality of main terminals 14 of FIG. 1 and FIG. 2, and are applied to the plurality of control terminals 15 as well. However, as a matter of course, the configuration is not limited thereto.

The dam bars 33 connect the plurality of electrode terminals 32. In this first embodiment, each dam bar 33 is disposed between two adjacent electrode terminals 32, and connects the two electrode terminals 32. Further, the plurality of electrode terminals 32 are connected by the dam bars 33 in one row.

As in the later description, in the sealing step, a front surface and a back surface of the dam bars 33 and the periphery thereof are clamped by a movable clamp to make a state of substantially isolating a space on the side of the one end 32a of the electrode terminal 32 and a space on the side of the another end 32b, and then a liquid resin is injected from the side of the one end 32a of the electrode terminal 32. According to such a manufacturing method, it is possible to prevent the liquid resin from flowing out toward the another end 32b of the electrode terminal 32. That is, it is possible to prevent, with the dam bars 33 or the like, the another end 32b of the electrode terminal 32 from adhering to or being immersed in the liquid resin to be the transfer mold resin 17.

The protruding portions 34 are formed at ends of the array of the plurality of electrode terminals 32, and protrude in an arraying direction of the plurality of electrode terminals 32. Distal ends of the protruding portions 34 are not coupled to any of the electrode terminals 32 and the frame, and serve as free ends. Note that, in this first embodiment, the ends of the array of the plurality of electrode terminals 32 correspond to both ends of the entire plurality of electrode terminals 32. However, the ends of the array are not limited thereto and may be formed on ends on only one side. Further, as illustrated in FIG. 3, positions of the protruding portions 34 and the dam bars 33 are arrayed in alignment, but the positions may be deviated to a certain extent.

A part of the plurality of electrode terminals 32 (ends 32b on another side or the like), the dam bars 33, and the protruding portions 34 that are described above are included in a part 36 of the structure illustrated in FIG. 3 and FIG. 4. As illustrated in FIG. 4, in this first embodiment, the part 36 of the structure has a flat-plate-like shape, but the shape is not limited thereto.

Figure 5:
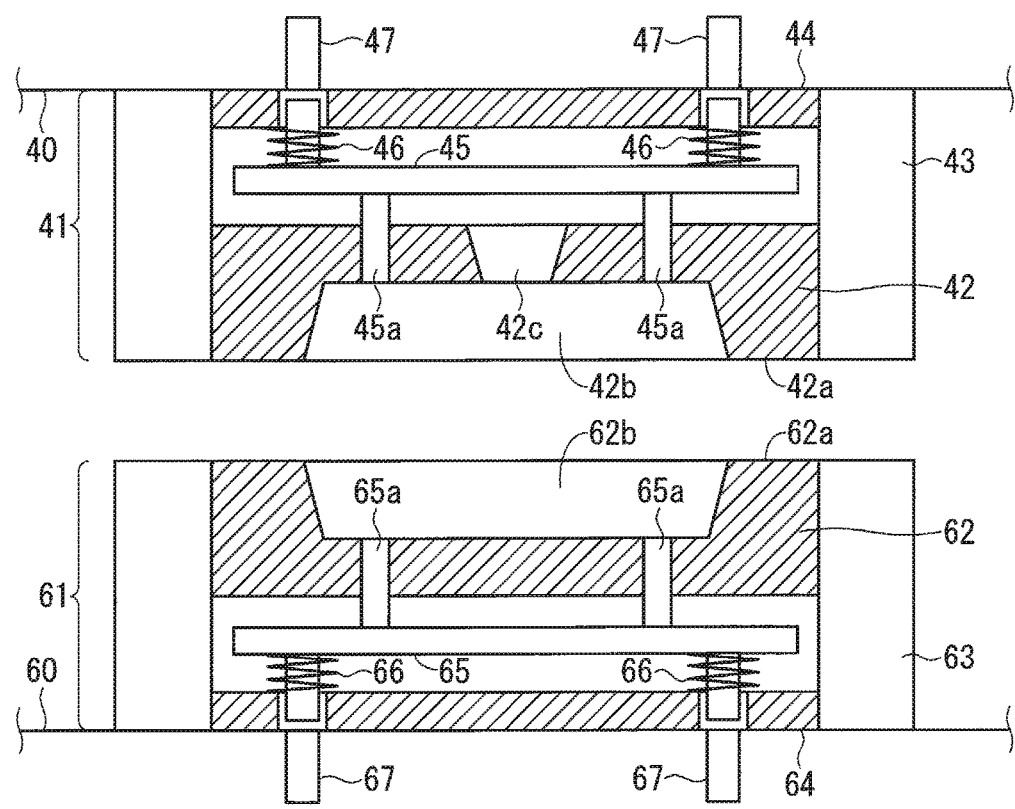
FIG. 5 is a sectional view for illustrating configuration of a resin-sealing mold according to the first embodiment.

Next, the sealing step is described in detail. FIG. 5 is a sectional view for illustrating configuration of a resin-sealing mold to be used in the sealing step according to this first embodiment.

The resin-sealing mold of FIG. 5 includes, as a pair of molds, an upper mold 41 provided in an upper-mold surface plate 40 and a lower mold 61 provided in a lower-mold surface plate 60. Through opening and closing of a resin-sealing pressing machine, which is not shown, contact and separation of the upper mold 41 and the lower mold 61 are performed. FIG. 5 is an illustration of a state in which the upper mold 41 and the lower mold 61 are separated. However, at the time when the upper mold 41 and the lower mold 61 come into contact, an internal space enclosed by the upper mold 41 and the lower mold 61 (hereinafter referred to as "mold internal space") is formed. Note that, the liquid resin to be the transfer mold resin 17 is to be injected into the mold internal space.

The upper mold 41 includes an upper-mold cavity block 42, an upper-mold frame block 43, an upper-mold top plate 44, an upper-mold movable plate 45, and a return spring 46.

In the upper-mold cavity block 42, an upper-mold cavity 42b is formed in a center of an upper-mold parting surface 42a that is contactable with the lower mold 61. Note that, the upper-mold cavity 42b is a recessed portion for forming an external shape of the transfer mold resin 17 of the semiconductor device 1, and defines an upper portion of the mold internal space.

Further, in the upper-mold cavity block 42 of the upper mold 41 (one of the pair of molds), a terminal hole 42c communicating with the mold internal space is also formed. The terminal hole 42c is a hole through which the part 36 of the structure is arranged (inserted), and in this first embodiment, opens in a vertical direction with respect to the upper-mold parting surface 42a.

The upper-mold movable plate 45 is accommodated in a hollow portion that is formed by the upper-mold cavity block 42, the upper-mold frame block 43, and the upper-mold top plate 44. A protruding portion wound by the return spring 46 of the upper-mold movable plate 45 is energized toward a hole of the upper-mold top plate 44 by the return spring 46. The protruding portion is pressed toward the mold internal space as appropriate by an upper-mold movable rod 47 that is capable of protruding from the upper-mold surface plate 40 and being accommodated into the upper-mold surface plate 40, and thus the upper-mold movable plate 45 is capable of moving downward. With the movement of the upper-mold movable plate 45, it is possible to make a push pin 45a for separating the structure sealed with a resin from the upper mold 41 protrude from the upper-mold cavity block 42 (bottom surface of the upper-mold cavity 42b), and to make the push pin 45a accommodated into the upper-mold cavity block 42, for example. In this manner, the movement of the upper-mold movable plate 45 can be subsidiarily performed in the contact and the separation of the upper mold 41 and the lower mold 61.

The lower mold 61 is formed similarly to the upper mold 41, and includes a lower-mold cavity block 62 having a lower-mold parting surface 62a and a lower-mold cavity 62b formed therein, a lower-mold frame block 63, a lower-mold top plate 64, a lower-mold movable plate 65 having a push pin 65a provided therein, and a return spring 66. Further, a protruding portion of the lower-mold movable plate 65 is pressed toward the mold internal space as appropriate by a lower-mold movable rod 67 that is capable of protruding from the lower-mold surface plate 60 and being accommodated into the lower-mold surface plate 60, and thus the lower-mold movable plate 65 is capable of moving upward.

Incidentally, in the resin sealing of a transfer molding method, the upper-mold parting surface 42a and the lower-mold parting surface 62a are attached by the above-mentioned resin-sealing pressing machine. With this, the mold internal space is formed, and a remaining part other than the part 36 of the structure (FIG. 3 and FIG. 4) is accommodated in the mold internal space.

Here, in parallel with the accommodation step, the part 36 of the structure is arranged (inserted) into the terminal hole 42c communicating with the mold internal space. Then, the part 36 of the structure is clamped by a movable clamp inside the terminal hole 42c and the movable clamp is fitted into the terminal hole 42c, thereby substantially closing the terminal hole 42c. The arrangement of the part 36 of the structure and the fitting of the movable clamp are described later in detail.

Subsequently, the liquid resin to be the transfer mold resin 17 (FIG. 1) is injected into the mold internal space through a gate being a resin injection opening (not shown). Note that, a thermosetting resin such as an epoxy resin is applied as the resin, for example. Heaters (not shown) are embedded in the upper-mold surface plate 40 and the lower-mold surface plate 60, and temperatures of the upper mold 41 and the lower mold 61 are raised by the heaters. The resin injected into the mold internal space is pressurized and is then cured by heat quantity from the upper mold 41 and the lower mold 61, thereby becoming the transfer mold resin 17. Subsequently, the upper-mold parting surface 42a and the lower-mold parting surface 62a are separated by the above-mentioned resin-sealing pressing machine, thereby completing a main sealing step. Subsequently, a part of the dam bars 33 is cut off, thereby making each of the electrode terminals 32 electrically independent.

Figure 6:
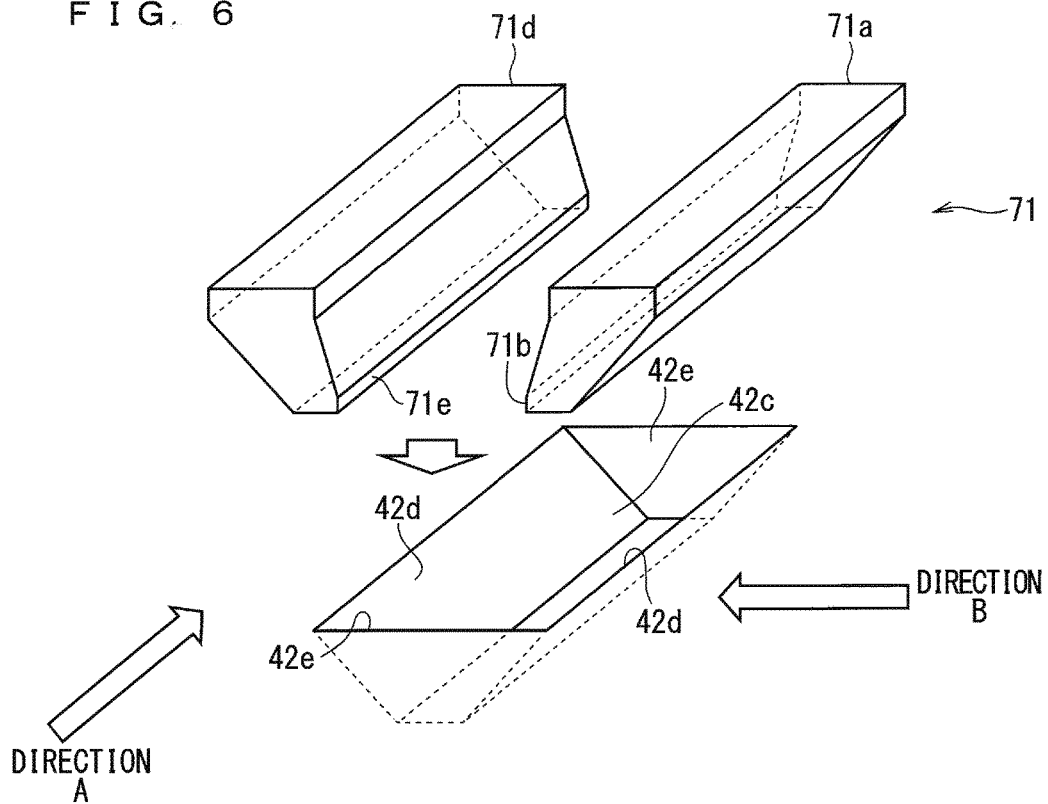
FIG. 6 is a view for illustrating a manufacturing method for the semiconductor device according to the first embodiment.
Figure 7:
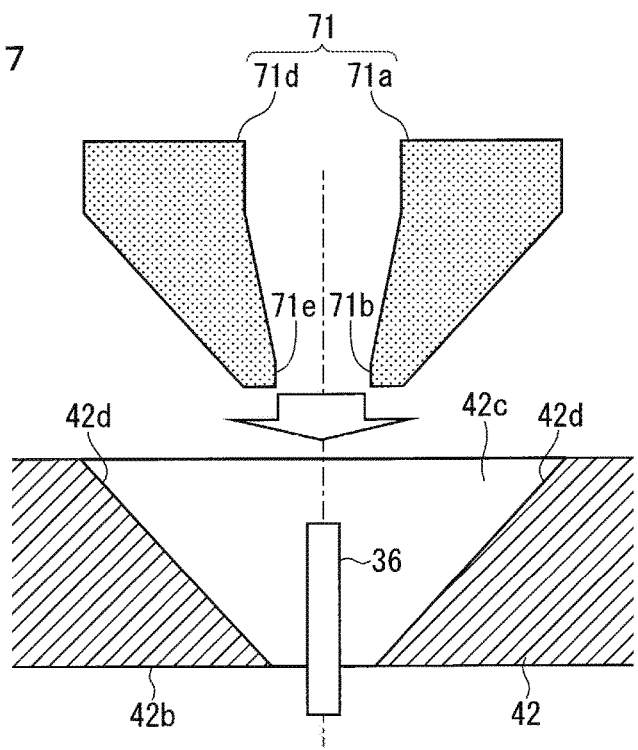
FIG. 7 is a view for illustrating the manufacturing method for the semiconductor device according to the first embodiment.
Figure 8:
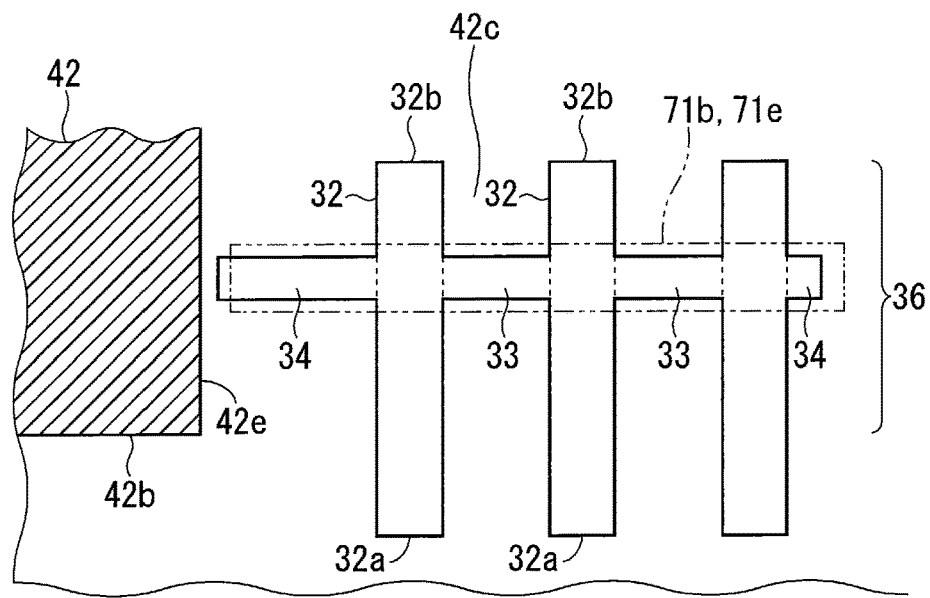
FIG. 8 is a view for illustrating the manufacturing method for the semiconductor device according to the first embodiment.
Figure 9:
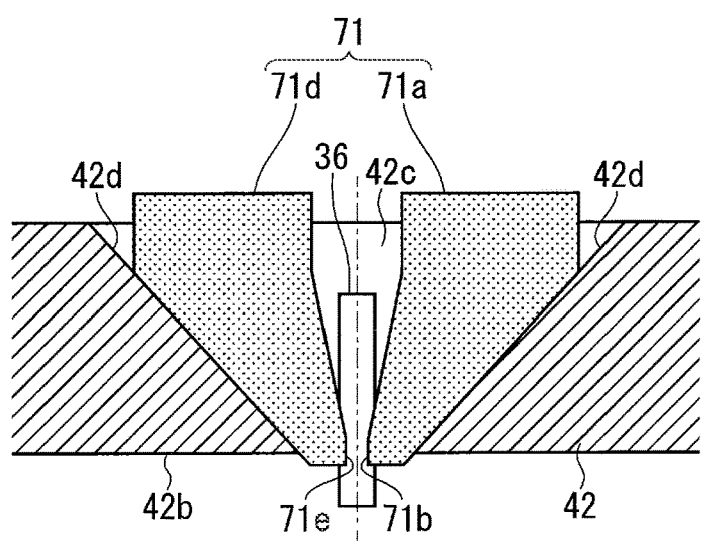
FIG. 9 is a view for illustrating the manufacturing method for the semiconductor device according to the first embodiment.
Figure 10:
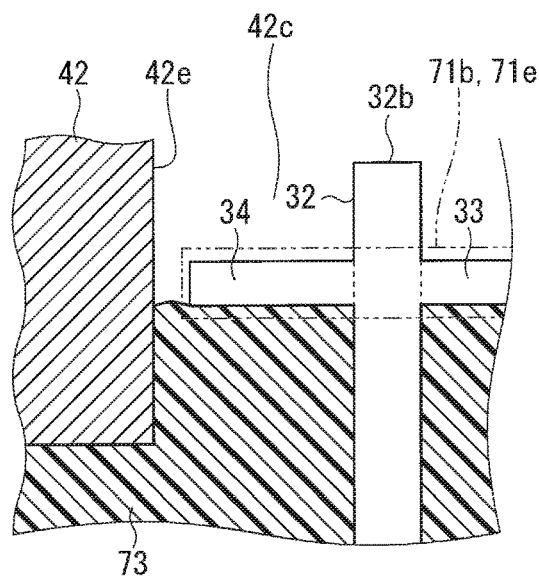
FIG. 10 is a view for illustrating the manufacturing method for the semiconductor device according to the first embodiment.

FIG. 6, FIG. 7, FIG. 8, FIG. 9, and FIG. 10 are views for illustrating arrangement of the part 36 of the structure, clamping of a movable clamp 71, fitting of the movable clamp 71, and injection of the resin. FIG. 6 is a perspective view of configuration in the periphery of the upper-mold cavity block 42, FIG. 7 and FIG. 9 are sectional views as viewed from a direction A of FIG. 6, and FIG. 8 and FIG. 10 are sectional views as viewed from a direction B of FIG. 6.

The terminal hole 42c extends along the direction A as illustrated in FIG. 6, and serves as a through-hole passing through the upper-mold cavity block 42 as illustrated in FIG. 7. The terminal hole 42c is, as illustrated in FIG. 6, defined by inner surfaces 42d positioned at ends of the terminal hole 42c in a transverse direction thereof and inner surfaces 42e positioned at ends of the terminal hole 42c in a longitudinal direction thereof. The inner surfaces 42d are, as illustrated in FIG. 7, inclined surfaces that are inclined in such a manner that the terminal hole 42c is tapered toward the upper-mold cavity 42b (toward the mold internal space), and the inner surfaces 42e are, as illustrated in FIG. 8, vertically formed with respect to the bottom surface of the upper-mold cavity 42b.

The movable clamp 71 includes a first part clamp 71a and a second part clamp 71d that extend along the direction A similarly to the terminal hole 42c. The first part clamp 71a and the second part clamp 71d each include a first clamp portion 71b and a second clamp portion 71e that oppose each other. The movable clamp 71 has such a shape that is capable of being fitted into the terminal hole 42c under a state in which the first clamp portion 71b and the second clamp portion 71e are brought close to each other.

Next, operations of the above configurations are described. First, a longitudinal direction of the part 36 of the structure and a longitudinal direction of the terminal hole 42c are aligned, and as illustrated in FIG. 7, the part 36 of the structure is arranged (inserted) into the terminal hole 42c from the upper-mold cavity 42b side (mold internal space side). In this first embodiment, as illustrated in FIG. 8, the part 36 of the structure is arranged into the terminal hole 42c so that the inner surface 42e of the terminal hole 42c and the protruding portions 34 of the part 36 of the structure come close to each other.

Then, the flat-plate-like part 36 of the structure is clamped from both sides in a thickness direction thereof by the movable clamp 71. Specifically, as indicated by the arrow of FIG. 7, the first part clamp 71a is moved toward the upper-mold cavity 42b (downward in FIG. 7) between the inner surfaces 42d of the terminal hole 42c and a first surface of the part 36 of the structure. Similarly, the second part clamp 71d is moved toward the upper-mold cavity 42b (downward in FIG. 7) between the inner surfaces 42d of the terminal hole 42c and a second surface of the part 36 of the structure, which is on the opposite side to the first surface. Note that, in this first embodiment, the movement of the first and second part clamps 71a and 71d is realized by an operation of the upper-mold movable plate 45 or the upper-mold movable rod 47, for example.

After the movable clamp 71 and the inner surfaces 42d are brought into contact, a force for moving the movable clamp 71 downward, that is, a force for fitting the movable clamp 71 into the terminal hole 42c, is decomposed into a force in a direction parallel with the inner surfaces 42d by the inner surfaces 42d being the inclined surfaces of the terminal hole 42c. With this, in this first embodiment, it is possible to utilize the force for fitting the movable clamp 71 into the terminal hole 42c as a force for clamping the part 36 of the structure with the movable clamp 71.

As a result of the above, as illustrated in FIG. 9, the movable clamp 71 is fitted into the terminal hole 42c, and the part 36 of the structure is clamped by the movable clamp 71 (first and second clamping portions 71b and 71e). Note that, in FIG. 8, the position of the first and second clamping portions 71b and 71e when the movable clamp 71 clamps the part 36 of the structure is indicated by an imaginary line (two-dot chain line).

Next, as illustrated in FIG. 10, a liquid resin 73 to be the transfer mold resin 17 is injected into the mold internal space. In this first embodiment, a pressure of clamping the part 36 of the structure with the movable clamp 71 is set to be larger than a pressure of injecting the resin 73.

The terminal hole 42c communicates with the mold internal space, and hence the resin 73 injected into the mold internal space moves toward the terminal hole 42c. Here, as illustrated in FIG. 10, the terminal hole 42c is substantially closed by the dam bars 33 and the movable clamp 71, and hence it is possible to prevent the resin 73 moving between the electrode terminals 32 from leaking outside across the dam bars 33.

Further, in this first embodiment, a gap between the inner surfaces 42e and the electrode terminals 32 is small due to the protruding portions 34. With this, fluidity of the resin 73 passing through the gap can be lowered, and hence it is possible to prevent the resin 73 from leaking outside across the protruding portions 34.

After the injection of the resin 73 is completed and the resin 73 is cured, the movable clamp 71 (first and second part clamps 71a and 71d) is removed from the terminal hole 42c, and the clamping of the part 36 of the structure by the movable clamp 71 is released.

Figure 11:
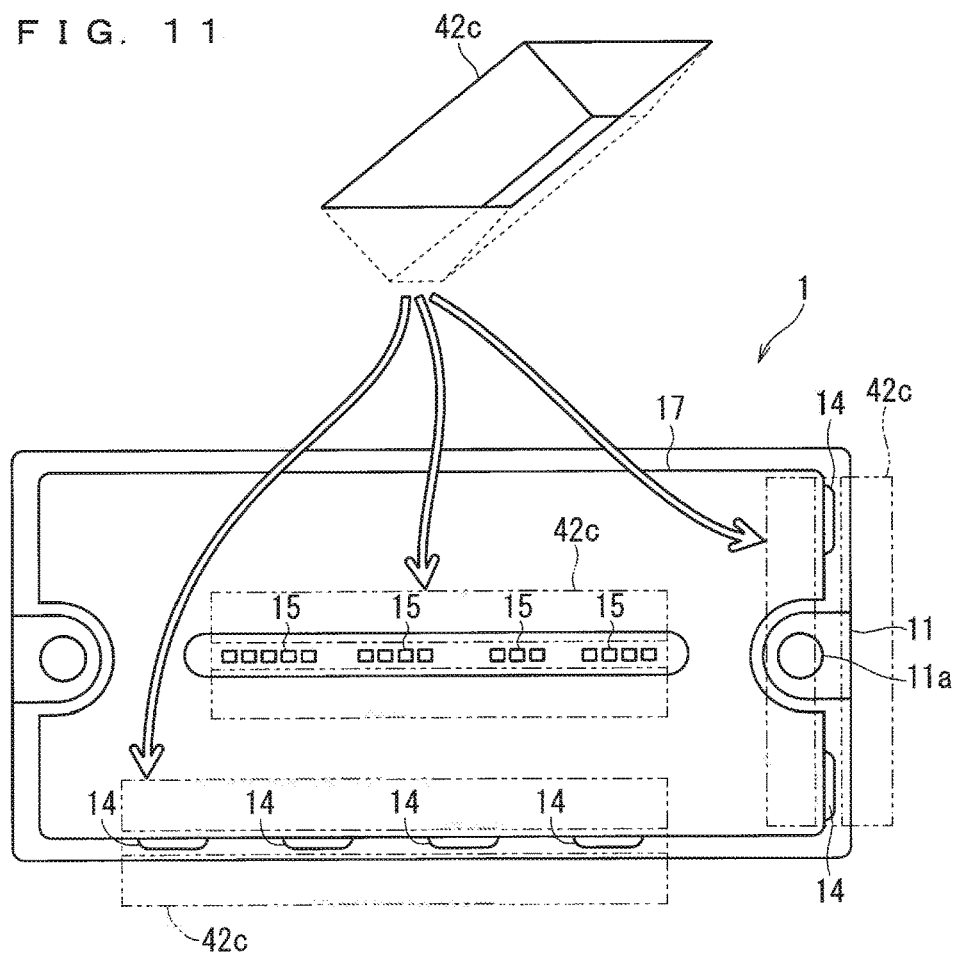
FIG. 11 is a view for illustrating an application example of the manufacturing method for the semiconductor device according to the first embodiment.

In this first embodiment, the plurality of electrode terminals 32 are applied to each of the main terminals 14 in one array, the main terminals 14 in one array that are arrayed in another direction therefrom, and the control terminals 15 in one array, which are illustrated in FIG. 11, and the steps of FIG. 6 to FIG. 10 are performed on each of those terminals. Note that, in FIG. 11, there is an illustration of the main terminals 14 before a bending step is performed, and the main terminals 14 illustrated in FIG. 1 are obtained when a bending step is performed on those terminals.

Here, with use of FIG. 12, FIG. 13, FIG. 14, FIG. 15, and FIG. 16, a manufacturing method related to a manufacturing method according to this first embodiment (hereinafter referred to as "related manufacturing method") is described. Note that, FIG. 12 and FIG. 13 are sectional views as viewed from a direction B similarly to FIG. 8, and FIG. 14 to FIG. 16 are external views as viewed from the direction B.

In this related manufacturing method, the protruding portions 34 are not formed in the electrode terminal frame 31. In such a related manufacturing method, similarly to the first embodiment, such a case is assumed as to clamp the plurality of electrode terminals 32 and the dam bars 33 with the movable clamp 71 inside the terminal hole 42c of the pair of molds and to fit the movable clamp 71 into the terminal hole 42c. In this case, similarly to the first embodiment, it is possible to dam up the outflow of the resin 73 to the outside in the sealing step with the dam bars 33 and the movable clamp 71, and to reduce the resin leak. However, the manufacturing method according to this first embodiment, which uses the protruding portions 34, can form a more preferable semiconductor device than the related manufacturing method. Description thereof is given below.

Figure 12:
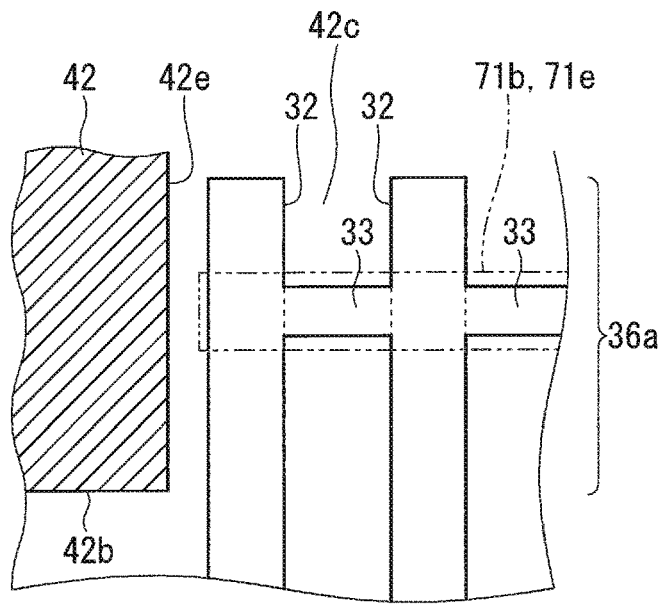
FIG. 12 is a view for illustrating a related manufacturing method.

As illustrated in FIG. 12, in the related manufacturing method, instead of the protruding portions 34, the part 36a of the structure is arranged (inserted) into the terminal hole 42c so that the endmost electrode terminal 32 and the inner surface 42e of the terminal hole 42c come close to each other.

Figure 13:
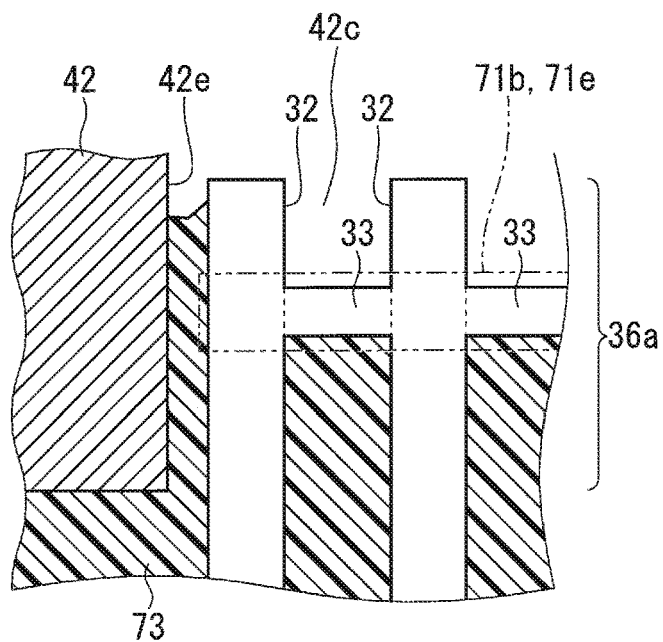
FIG. 13 is a view for illustrating the related manufacturing method.

Subsequently, similarly to the first embodiment, after the movable clamp 71 is clamped and the movable clamp 71 is fitted, as illustrated in FIG. 13, the resin is injected into the mold internal space.

Figure 14:
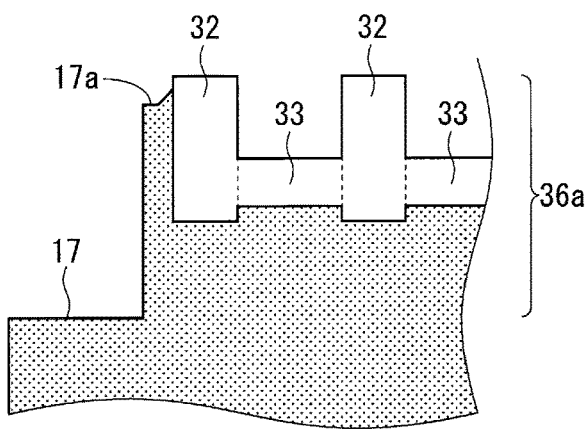
FIG. 14 is a view for illustrating the related manufacturing method.

Then, as illustrated in FIG. 14, after the resin 73 is cured to be the transfer mold resin 17, the clamping of the part 36 of the structure by the movable clamp 71 is released, and the structure is removed from the mold. As illustrated in FIG. 14, in the related manufacturing method, a burr 17a of the transfer mold resin 17 is formed adjacently to the endmost electrode terminal 32.

Figure 15:
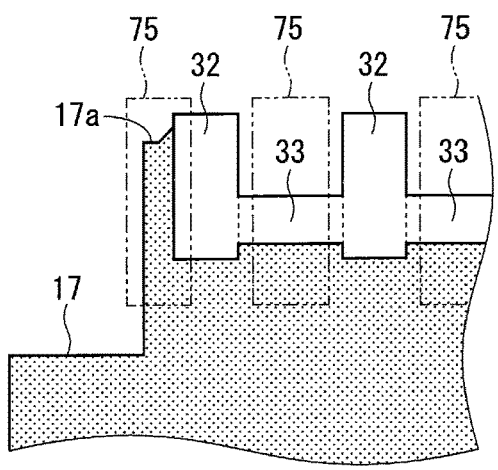
FIG. 15 is a view for illustrating the related manufacturing method.
Figure 16:
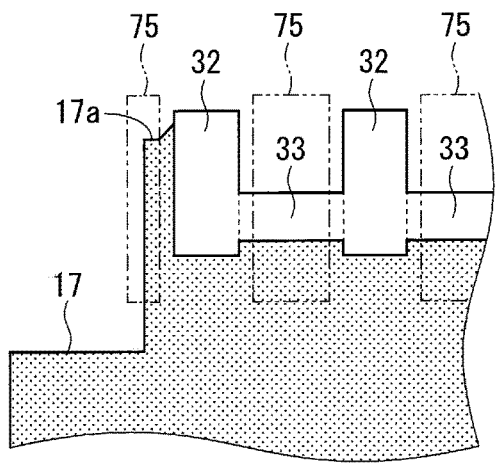
FIG. 16 is a view for illustrating the related manufacturing method.

Subsequently, with use of a punch die, the burr 17a and a part of the dam bars 33 are cut off, for example. Here, in order to remove the burr 17a, the punch die is designed so as to be applied to a boundary between the burr 17a and the endmost electrode terminal 32. However, variation is generated of positions of the punch die and the molded article obtained after being sealed with resin, and hence as illustrated in FIG. 15 and FIG. 16, positional displacement may be generated between the punch die and the molded article obtained after being sealed with resin. Here, in FIG. 15 and FIG. 16, a removal region 75 to be removed by the punch die is indicated by an imaginary line (two-dot chain line).

In a case where such positional displacement as illustrated in FIG. 15 is generated, not only the burr 17a but a part of the endmost electrode terminal 32 is also cut off by the punch die. As a result, a width of the endmost electrode terminal 32 becomes narrow, thereby generating a contact failure between the electrode terminal 32 and a female electrode of an outer device to be joined (not shown) in some cases.

In a case where such positional displacement as illustrated in FIG. 16 is generated, the endmost electrode terminal 32 is not cut off, but a part of the burr 17a that is adjacent to the electrode terminal 32 is remained. As a result, the remaining burr causes an electrical contact failure in following testing steps, a step of attaching to a system, or the like in some cases.

On the contrary, in this first embodiment, as illustrated in FIG. 10, the protruding portion 34 is formed, and hence a gap portion between the inner surface 42e and the protruding portion 34 and the endmost electrode terminal 32, in which a burr is to be formed, can be separated. As a result, the burr can be prevented from being formed adjacently to the endmost electrode terminal 32, and hence it is possible to prevent defects caused by burrs further than the related manufacturing method.

<Gist of First Embodiment>

In this first embodiment as described above, the plurality of electrode terminals 32 and the dam bars 33 are clamped by the movable clamp 71 inside the terminal hole 42c of the pair of molds and the movable clamp 71 is fitted into the terminal hole 42c. Subsequently, the resin 73 is injected into the mold internal space. According to such a manufacturing method, it is possible to dam up the liquid resin 73 to flow out to the outside with the dam bars 33 and the movable clamp 71. Accordingly, the resin leak can be reduced, and hence it is possible to prevent resin burrs and to prevent impediment to electrical contact due to unnecessary resin adhesion. Further, the plurality of electrode terminals 32 are connected by the dam bars 33, and hence it is possible to reduce the number of components and man-hours.

Further, in this first embodiment, the part 36 of the structure is inserted into the terminal hole 42c so that the inner surfaces 42e of the terminal hole 42c and the protruding portions 34 of the part 36 of the structure come close to each other, and hence it is possible to reduce the gap between the inner surfaces 42e and the protruding portions 34. Accordingly, fluidity of the resin 73 passing through the gap can be lowered, and hence it is possible to further reduce the resin leak. Further, it is possible to prevent defects caused by burrs further than the related manufacturing method.

Further, in this first embodiment, the terminal hole 42c of the pair of molds is formed in one of the pair of molds, and opens in the vertical direction with respect to the upper-mold parting surface 42a of the pair of molds. With this, it is possible to obtain the above-mentioned effects for the semiconductor device including electrodes such as the main terminals 14 and the control terminals 15 that extend in the height direction thereof. Note that, the terminal hole 42c is not limited thereto, and may be formed so as to open in a horizontal direction with respect to the upper-mold parting surface 42a, or may also be formed in the upper mold 41 and in the lower mold 61 in the configuration thereof, for example. In this case, it is possible to obtain the above-mentioned effects for the semiconductor device including electrodes that extend in a lateral direction.

Further, in this first embodiment, the movable clamp 71 clamps the flat-plate-like part 36 of the structure from both the sides in the thickness direction thereof. With this, a gap between the movable clamp 71 and the part 36 of the structure can be reduced, and hence it is possible to further reduce the resin leak.

Further, in this first embodiment, the force for fitting the movable clamp 71 into the terminal hole 42c is utilized as the force for clamping the part 36 of the structure with the movable clamp 71. With this, individual power sources are not needed for those forces, and hence it is possible to simplify the mold structure.

Here, hypothetically, in a case where a pressure of clamping the part 36 of the structure with the movable clamp 71 is smaller than a pressure of injecting the resin 73, the movable clamp 71 may open at the time of injecting the resin 73 and the resin leak may be generated. On the contrary, in this first embodiment, the pressure of clamping the part 36 of the structure with the movable clamp 71 is larger than the pressure of injecting the resin 73, and hence it is possible to prevent the resin leak.

First Modified Example

A shape of the protruding portions 34 for closing the gap between the inner surfaces 42e of the terminal hole 42c and the electrode terminals 32 is not limited to the shape of FIG. 3. For example, as illustrated in FIG. 17, FIG. 18, FIG. 19, FIG. 20, FIG. 21, and FIG. 22, extending portions 34a and 34b that extend along the inner surfaces 42e of the terminal hole 42c may be formed in the distal ends of the protruding portions 34.

Figure 17:
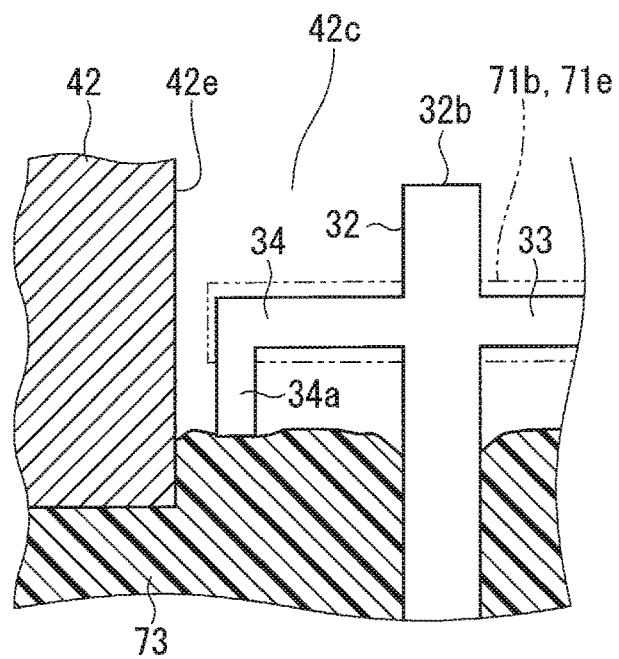
FIG. 17 is a view for illustrating the manufacturing method for the semiconductor device according to a first modified example.
Figure 18:
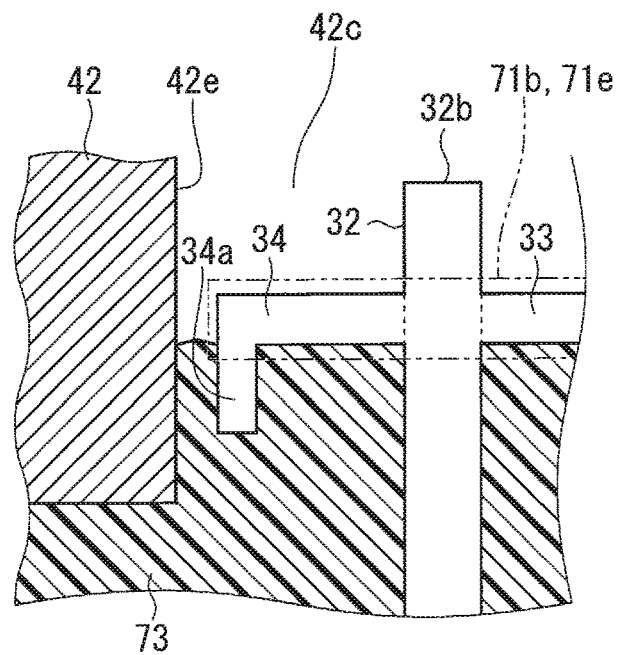
FIG. 18 is a view for illustrating the manufacturing method for the semiconductor device according to the first modified example.
Figure 19:
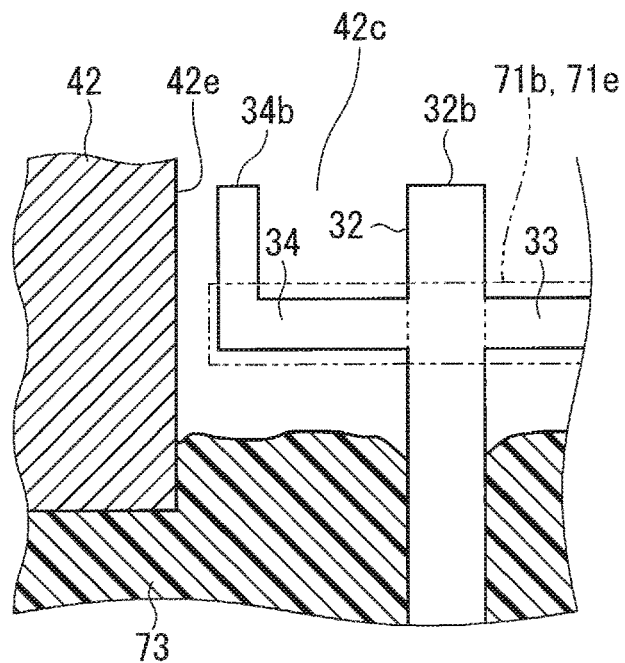
FIG. 19 is a view for illustrating the manufacturing method for the semiconductor device according to the first modified example.
Figure 20:
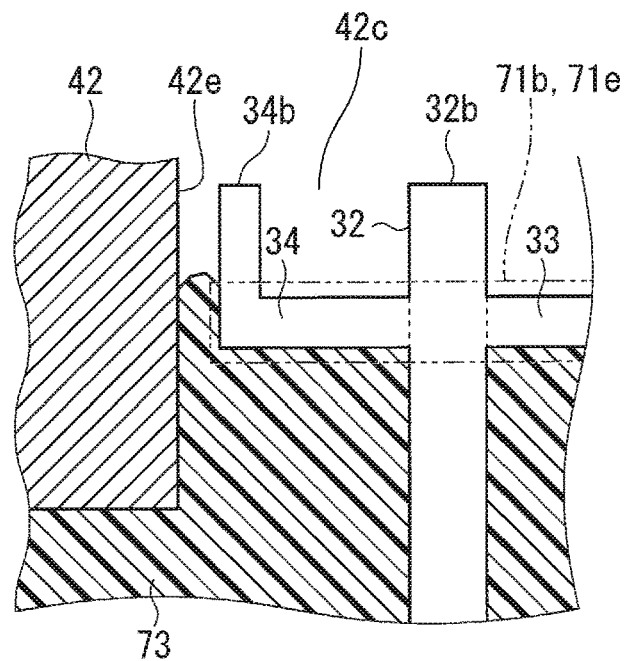
FIG. 20 is a view for illustrating the manufacturing method for the semiconductor device according to the first modified example.
Figure 21:
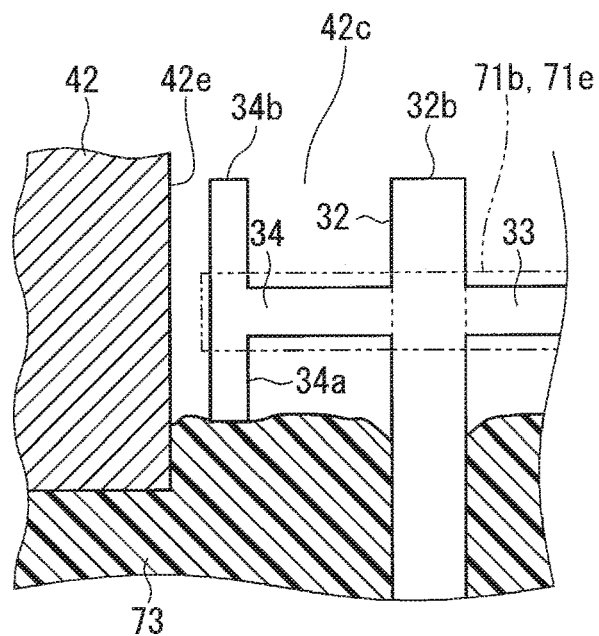
FIG. 21 is a view for illustrating the manufacturing method for the semiconductor device according to the first modified example.
Figure 22:
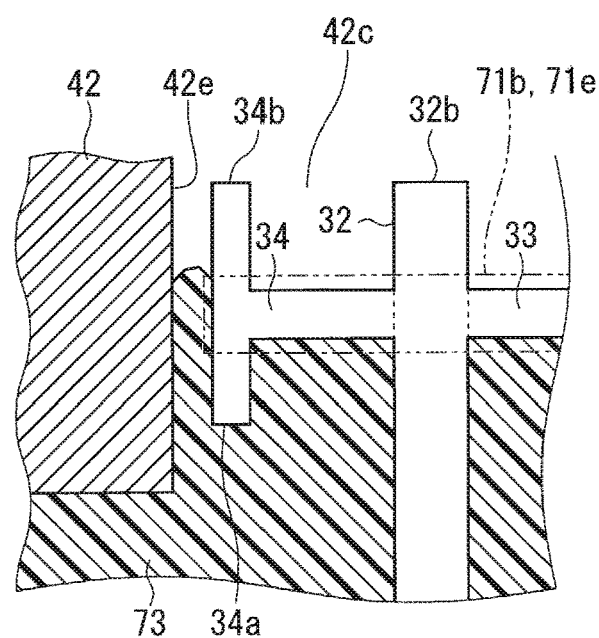
FIG. 22 is a view for illustrating the manufacturing method for the semiconductor device according to the first modified example.

Note that, FIG. 17, FIG. 19, and FIG. 21 are sectional views for illustrating a state in the middle of the injection of the resin 73, and FIG. 18, FIG. 20, and FIG. 22 are sectional views for illustrating a state after completion of the injection of the resin 73.

The extending portion 34a of FIG. 17 and FIG. 18 extends in a direction from the distal end of the protruding portion 34 toward the semiconductor element 13 (toward mold internal space). A length of the extending portion 34a is, for example, about 0.3 mm or less. According to such a configuration, it is possible to lengthen a path through which the resin 73 flows out to the outside passing the gap between the inner surface 42e and the protruding portion 34. For this reason, before the resin 73 passes through the gap between the inner surface 42e and the protruding portion 34, it is possible to obtain higher chances of completing the curing through a curing reaction due to the heat quantity from the mold. Accordingly, it is possible to further prevent the resin leak. This is particularly effective in a case where a low-viscosity resin is used as the resin 73 and the like.

The extending portion 34b of FIG. 19 and FIG. 20 extends in a direction opposite to the direction from the distal end of the protruding portion 34 toward the semiconductor element 13. Even in such a configuration, similarly to the extending portion 34a of FIG. 17 and FIG. 18, it is possible to further prevent the resin leak. Further, generally, such designing is possible as to make the extending portion 34b of FIG. 19 and FIG. 20 extend longer than the extending portion 34a of FIG. 17 and FIG. 18, and hence prevention of the resin leak can be further expected than the configuration of FIG. 17 and FIG. 18.

In FIG. 21 and FIG. 22, both the extending portions 34a and 34b are formed in the distal end of the protruding portion 34. According to such a configuration, the above path can be further lengthened than the configuration of FIG. 17 to FIG. 20, and hence it is possible to enhance the effects of preventing the resin leak.

Second Modified Example

Figure 23:
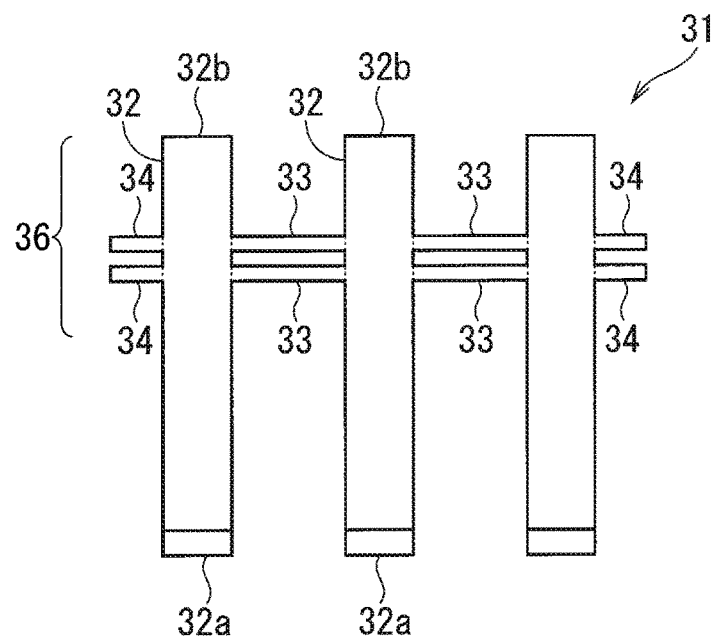
FIG. 23 is a view for illustrating the manufacturing method for the semiconductor device according to a second modified example.
Figure 24:
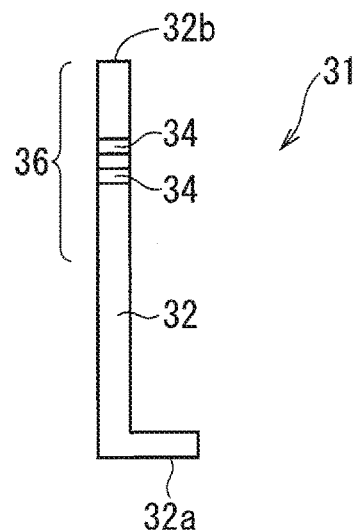
FIG. 24 is a view for illustrating the manufacturing method for the semiconductor device according to the second modified example.

In the first embodiment, the plurality of electrode terminals 32 are connected by the dam bars 33 in one row (FIG. 3). However, the configuration is not limited thereto, and the plurality of electrode terminals 32 may be connected by the dam bars 33 in a plurality of rows. For example, as illustrated in FIG. 23 and FIG. 24, the plurality of electrode terminals 32 may be connected by the dam bars 33 in two rows (branched electrode-terminal dam bars). Note that, as illustrated in FIG. 23, in accordance with the dam bars 33 being in a plurality of rows, a plurality of the protruding portions 34 may be formed.

Here, in order to maintain parallelism of the plurality of electrode terminals 32 in a manufacturing process, a width of the dam bars 33 may be made thick and a mechanical strength of the dam bars 33 may be enhanced. However, when the thickness of the dam bars 33 is made excessively thick, a large force is needed at the time of cutting off the dam bars 33, thereby upsizing facilities. Further, a wear life of a cutting die is shortened.

On the contrary, according to this second modified example, rows of the dam bars 33 are increased and a quadrangle structure or the like is formed, for example, and thus without making the width of the dam bars 33 thick, it is possible to obtain a mechanical strength similar to a configuration in which the dam bars 33 are made thick. With this, it is possible to secure the parallelism of the plurality of electrode terminals 32. Further, the width of each dam bar 33 can be made narrow comparatively, and hence it is possible to reduce the force at the time of cutting off the dam bars 33. As a result, it is possible to realize downsizing of the facilities, prolonging of the wear life of the cutting die, or the like.

Note that, the above-mentioned first modified example and second modified example are also applicable to a second embodiment and the following embodiment to be described later.

Second Embodiment

In the first embodiment, the part 36 of the structure is clamped (FIG. 7 and FIG. 9) utilizing the force in which the movable clamp 71 is moved toward the upper-mold cavity 42b (downward in FIG. 7) to be fitted therein due to the operation of the upper-mold movable plate 45 (FIG. 5) or the upper-mold movable rod 47 (FIG. 5). On the contrary, in the second embodiment of the present invention, the movable clamp 71 is configured to clamp the part 36 of the structure due to an operation of the above-mentioned resin-sealing pressing machine on which the structure and the pair of molds (upper mold 41 and lower mold 61) are to be placed. In the following, in this second embodiment, components that are the same or similar to those in the first embodiment are denoted by the same reference symbols, and different components are mainly described.

Figure 25:
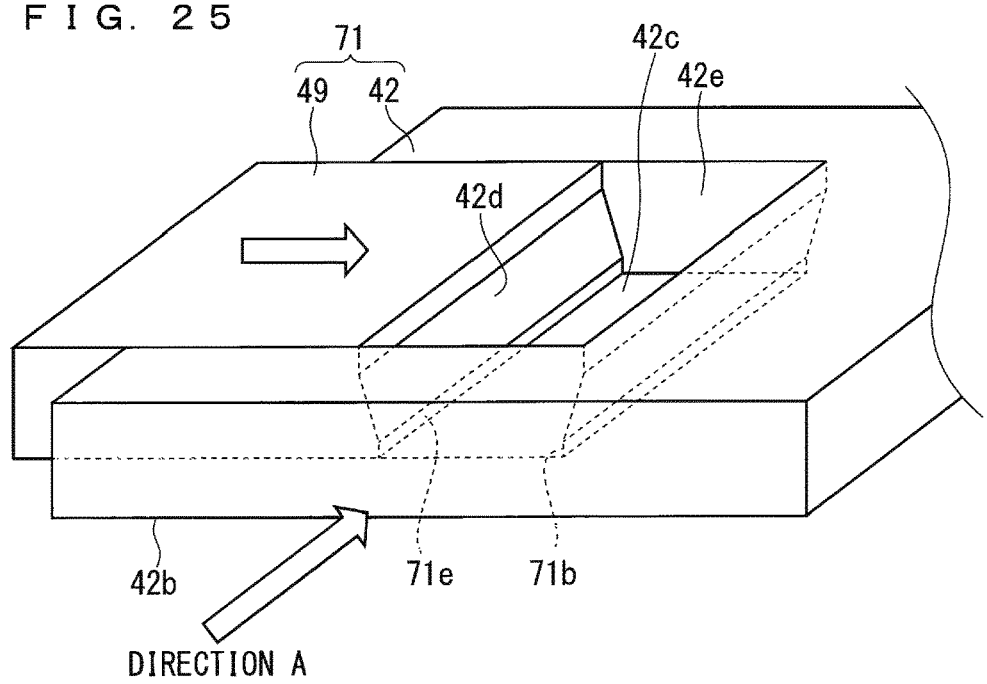
FIG. 25 is a view for illustrating the manufacturing method for the semiconductor device according to a second embodiment.
Figure 26:
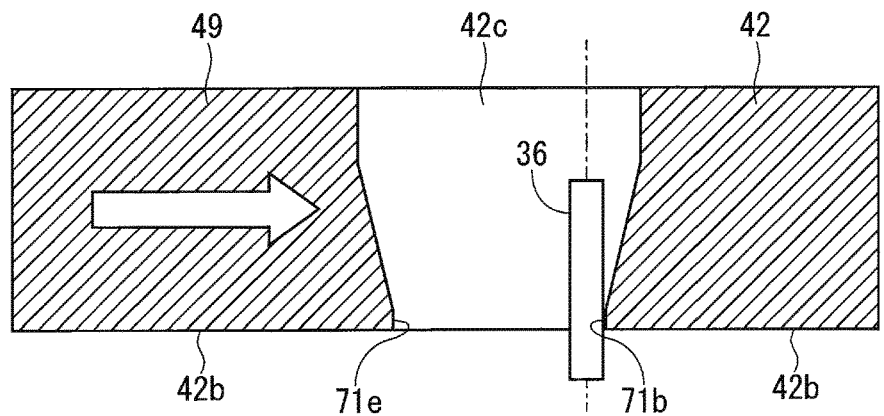
FIG. 26 is a view for illustrating the manufacturing method for the semiconductor device according to the second embodiment.
Figure 27:
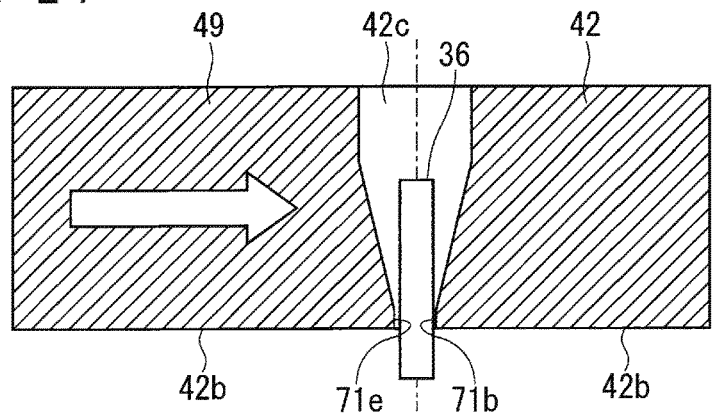
FIG. 27 is a view for illustrating the manufacturing method for the semiconductor device according to the second embodiment.
Figure 28:
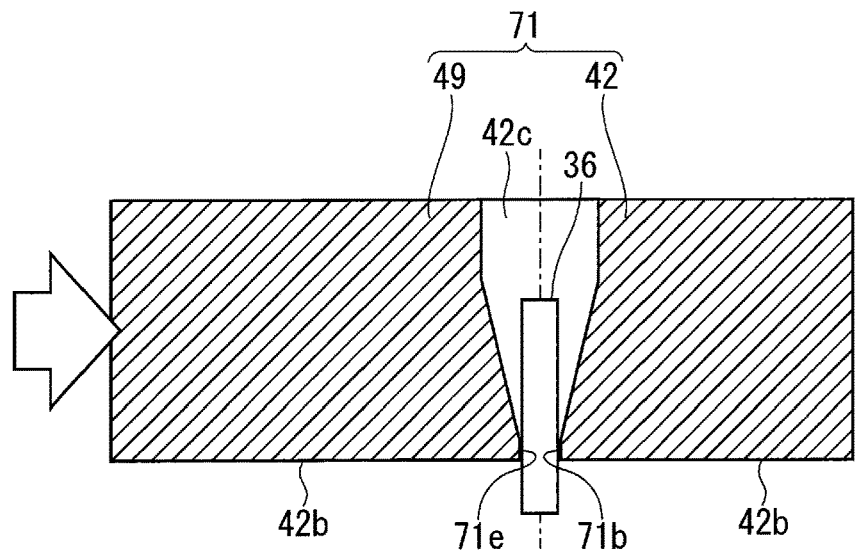
FIG. 28 is a view for illustrating the manufacturing method for the semiconductor device according to the second embodiment.

FIG. 25, FIG. 26, FIG. 27, and FIG. 28 are views for illustrating arrangement of the part 36 of the structure, clamping of the movable clamp 71, and fitting of the movable clamp 71. FIG. 25 is a perspective view of configuration in the periphery of the upper-mold cavity block 42, and FIG. 26, FIG. 27, and FIG. 28 are sectional views as viewed from a direction A of FIG. 25.

In this second embodiment, the upper mold 41 further includes an upper-mold movable block 49. In a center portion at one end of the upper-mold cavity block 42 as viewed from above, there is formed as the terminal hole 42c being a recessed portion. The upper-mold movable block 49 is configured to be slidable inside the terminal hole 42c in the horizontal direction.

The upper-mold cavity block 42 and the upper-mold movable block 49 each include the first clamp portion 71b and the second clamp portion 71e that oppose each other in the terminal hole 42c on the upper-mold cavity 42b side (mold internal space side). Further, in this second embodiment, the upper-mold cavity block 42 and the upper-mold movable block 49 are used as the movable clamp 71. Description thereof is given in detail below.

As illustrated in FIG. 25, FIG. 26, and FIG. 27, the upper-mold movable block 49 being a part of the upper mold 41 is movable in a horizontal direction (lateral direction) of the resin-sealing pressing machine. Further, such a configuration is employed that the second clamp portion 71e of the upper-mold movable block 49 is capable of being moved in a direction approaching to the first clamp portion 71b of the upper-mold cavity block 42 (direction to the right) by a pusher of the resin-sealing pressing machine (not shown). In this second embodiment configured in such a manner, it is possible to generate, from the force of the resin-sealing pressing machine, a force for clamping the part 36 of the structure with the movable clamp 71.

As a result of the above, as illustrated in FIG. 28, a part of the movable clamp 71 (upper-mold movable block 49) is fitted to the terminal hole 42c, and the part 36 of the structure is clamped by the movable clamp 71 (first and second clamping portions 71b and 71e). Note that, here, after the second clamp portion 71e is brought into contact to the part 36 of the structure, the second clamp portion 71e is further moved in the direction approaching to the first clamp portion 71b (direction to the right) by only approximately about 0.2 mm or less. With this, mold clamping of the part 36 of the structure is performed.

Subsequently, similarly to the first embodiment, the liquid resin 73 to be the transfer mold resin 17 is injected into the mold internal space. After the injection of the resin 73 is completed and the resin 73 is cured, the clamping of the part 36 of the structure by the movable clamp 71 is released.

Note that, when the clamping of the part 36 of the structure by the movable clamp 71 is released, the second clamp portion 71e of the upper-mold movable block 49 is moved in a direction separating away from the first clamp portion 71b of the upper-mold cavity block 42 (direction to the left). Such movement may be performed by pressing of the upper-mold movable block 49 with the pusher of the resin-sealing pressing machine (not shown), or by pressing of the upper-mold movable block 49 with a spring (not shown) or the like.

<Gist of Second Embodiment>

As in the first embodiment, in the configuration utilizing the force for fitting the movable clamp 71 into the terminal hole 42c as the force for clamping the part 36 of the structure with the movable clamp 71, a sufficient surface pressure may not be obtained in some cases in designing of a surface pressure of the mold. On the contrary, according to this second embodiment, the force for clamping the part 36 of the structure with the movable clamp 71 is generated from the force of the resin-sealing pressing machine, and hence it is possible to obtain a sufficient surface pressure.

Third Modified Example

Figure 29:
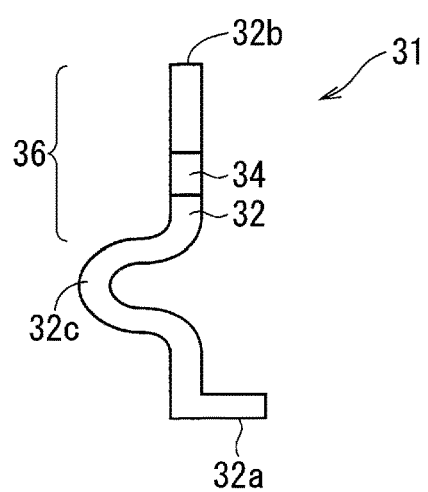
FIG. 29 is a view for illustrating the manufacturing method for the semiconductor device according to a third modified example.

As illustrated in FIG. 29, a flexible portion 32c having flexibility may be formed in a portion of the electrode terminal 32 on the semiconductor element 13 side with respect to a portion that is clamped by the movable clamp 71. Note that, the portion of the electrode terminal 32 that is clamped by the movable clamp 71 is substantially the same as portions in which the dam bars 33 and the protruding portions 34 are formed.

Note that, in the example of FIG. 29, a shape of the flexible portion 32c has such a shape as laying down the letter U, but the shape is not limited thereto as long as the flexible portion 32c has a shape having more flexibility than other parts. For example, the shape of the flexible portion 32c may have a wavy shape, may have a shape of the letter S, or have a shape formed of straight lines and bending points as a pointed U-like shape.

Figure 30:
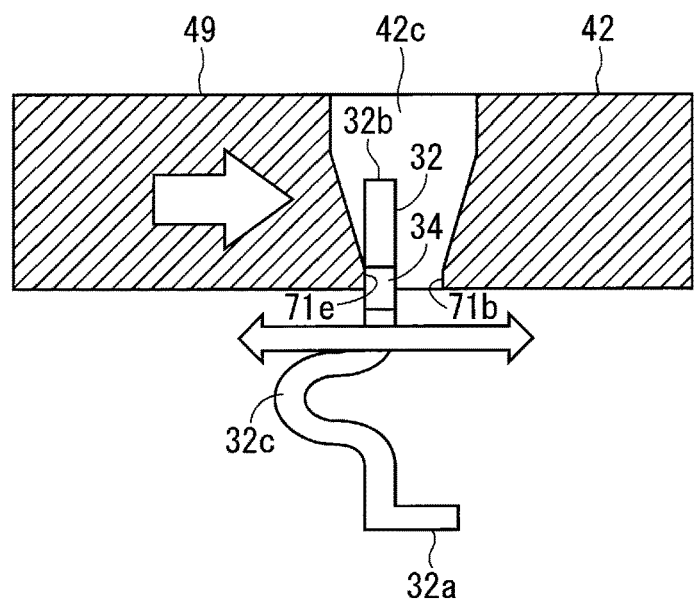
FIG. 30 is a view for illustrating the manufacturing method for the semiconductor device according to the third modified example.

According to such a configuration, as illustrated in FIG. 30, even when the portion of the electrode terminal 32 to be clamped is moved from the time at which the time the movable clamp 71 is brought into contact to the electrode terminal 32 (part 36 of the structure) to the time at which the mold clamping is performed, a force generated along with the movement can be absorbed by the flexible portion 32c. Accordingly, at the time of the mold clamping, a stress to be applied to a portion of the electrode terminal 32 on the semiconductor element 13 side (such as a bottom of the frame and a portion of the frame joined to the electrode of the substrate with solder or the like, for example) can be reduced. With this, it is possible to reduce damage in a joining portion or the like, and to enhance reliability of the joining portion or the like.

Note that, this third modified example is herein applied to the second embodiment, but may also be applied to the first embodiment as a matter of course.

Third Embodiment

In the first embodiment, description is given that the creepage distance 81 of FIG. 1 needs to be lengthened. However, lengthening the creepage distance 81 and reducing the size of the semiconductor device 1 are in a contradictory relationship. On the contrary, in the third embodiment of the present invention, it is possible to lengthen the creepage distance 81 while maintaining the semiconductor device 1 in a small size.

Figure 31:
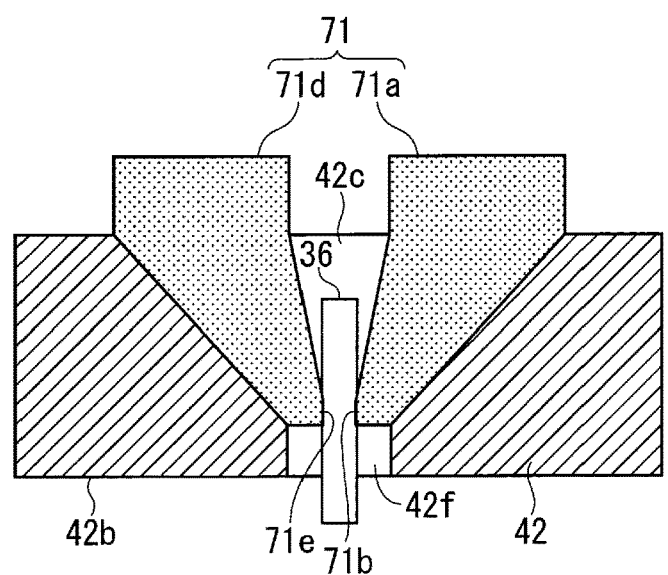
FIG. 31 is a view for illustrating the manufacturing method for the semiconductor device according to a third embodiment.
Figure 32:
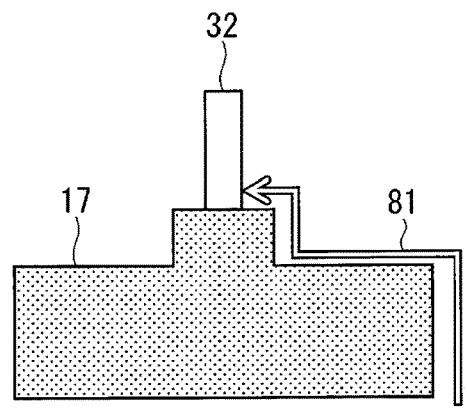
FIG. 32 is a view for illustrating the manufacturing method for the semiconductor device according to the third embodiment.

FIG. 31 is a sectional view for illustrating the sealing step according to this third embodiment, and FIG. 32 is an external view for illustrating a partial configuration of the semiconductor device 1 that is formed through the sealing step.

As illustrated in FIG. 31, in this third embodiment, in a case where the movable clamp 71 is fitted into the terminal hole 42c, a recessed portion 42f is formed, which has inner surfaces of the terminal hole 42c where the electrode terminals 32 are arranged as lateral portions and distal end portions of the movable clamp 71 (distal end portions of the first and second clamping portions 71b and 71e) as bottom portions. The recessed portion 42f opens on the mold internal space side. Further, when the resin is injected into the mold internal space, the resin is injected being in contact with the recessed portion 42f. That is, the resin is injected so as to close the recessed portion 42f.

In the semiconductor device 1 formed through the steps as described above, as illustrated in FIG. 32, the transfer mold resin 17 protrudes in the periphery of the electrode terminal 32. For this reason, it is possible to lengthen the creepage distance 81 while maintaining the size of the semiconductor device 1.

Note that, this third embodiment is not limited to the above. Two different configurations of this third embodiment are described below.

Figure 33:
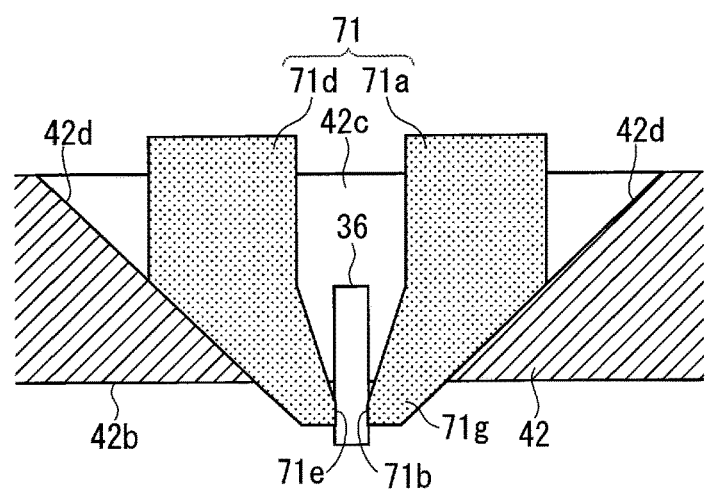
FIG. 33 is a view for illustrating the manufacturing method for the semiconductor device according to the third embodiment.
Figure 34:
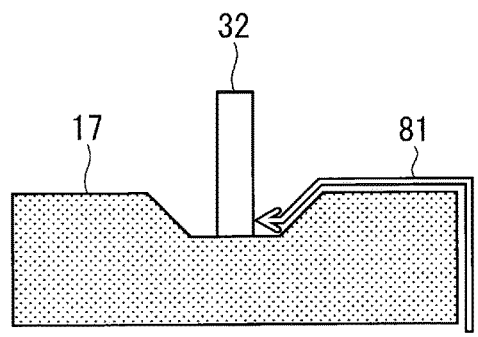
FIG. 34 is a view for illustrating the manufacturing method for the semiconductor device according to the third embodiment.

FIG. 33 is a sectional view for illustrating the sealing step according to this third embodiment, and FIG. 34 is an external view for illustrating a partial configuration of the semiconductor device 1 that is formed through the sealing step.

As illustrated in FIG. 33, in this third embodiment, in a case where the movable clamp 71 is fitted into the terminal hole 42c, the distal end portions of the movable clamp 71 (distal end portions of the first and second clamping portions 71b and 71e) protrude from the terminal hole 42c where the electrode terminals 32 are arranged, thereby forming a protruding portion 71g. The protruding portion 71g protrudes from the bottom surface of the upper-mold cavity 42b toward the mold internal space. Further, when the resin is injected into the mold internal space, the resin is injected being in contact with the protruding portion 71g. That is, the resin is injected so as to cover the protruding portion 71g.

In the semiconductor device 1 formed through the steps as described above, as illustrated in FIG. 34, the transfer mold resin 17 is recessed in the periphery of the electrode terminals 32. For this reason, it is possible to lengthen the creepage distance 81 while maintaining the size of the semiconductor device 1.

Figure 35:
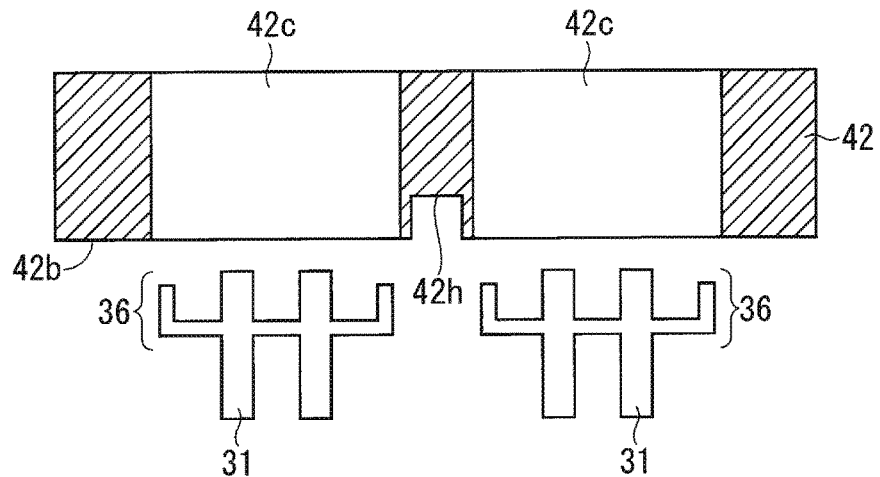
FIG. 35 is a view for illustrating the manufacturing method for the semiconductor device according to the third embodiment.
Figure 36:
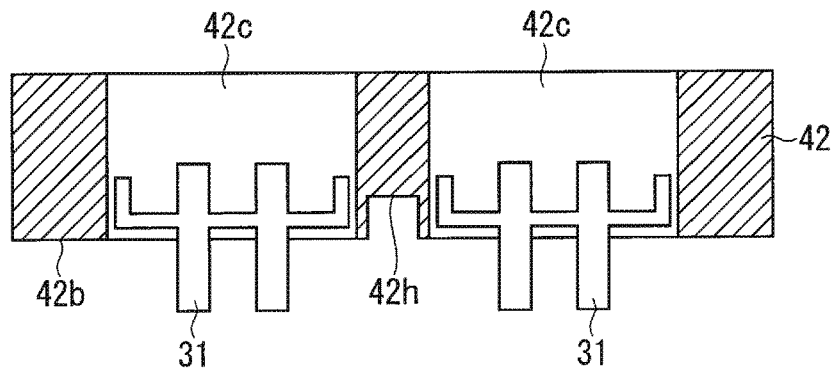
FIG. 36 is a view for illustrating the manufacturing method for the semiconductor device according to the third embodiment.
Figure 37:
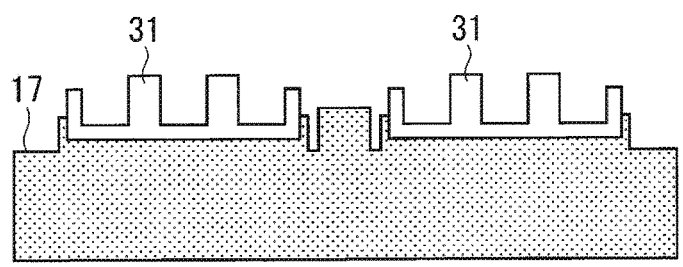
FIG. 37 is a view for illustrating the manufacturing method for the semiconductor device according to the third embodiment.

FIG. 35 and FIG. 36 are sectional views for illustrating the sealing step according to this third embodiment, and FIG. 37 is an external view for illustrating a partial configuration of the semiconductor device 1 that is formed through the sealing step.

As illustrated in FIG. 35 and FIG. 36, the pair of molds (herein the upper mold 41) is provided such that a plurality of the terminal holes 42c in which a plurality of the parts 36 of the structures are to be respectively arranged communicate with one mold internal space. Further, a recessed portion 42h is formed in, out of surfaces of the pair of molds (herein a surface of the upper mold 41), a surface between two adjacent terminal holes 42c on the mold internal space side. Then, as described in the above, after the movable clamp 71 is clamped and the movable clamp 71 is fitted, the resin is injected into the mold internal space. At this time, the resin is injected being in contact with the recessed portion 42h. That is, the resin is injected so as to close the recessed portion 42h.

In the semiconductor device 1 formed through the steps as described above, as illustrated in FIG. 37, the transfer mold resin 17 protrudes between a group of electrode terminals 32 and another group of electrode terminals 32. For this reason, it is possible to lengthen the creepage distance while maintaining the size of the semiconductor device 1.

Note that, a configuration of forming the recessed portion 42h is herein described, but the configuration is not limited thereto, and a protruding portion may be formed instead of the recessed portion 42h, or both of the recessed portion 42h and a protruding portion may be formed. Even with such a configuration, it is possible to lengthen the creepage distance 81 similarly to the above-mentioned configuration.

Note that, in the present invention, each of the embodiments and each of the modified examples may be freely combined, and each of the embodiments and each of the modified examples may be modified or omitted as appropriate within the scope of the invention.

The present invention is described in detail in the above, but the description of the above is merely an example in any mode, and the present invention is not to be limited thereto. It is to be understood that a numerous modified examples not given as examples herein may be assumed without departing from the scope of the present invention.

EXPLANATION OF REFERENCE SIGNS 1 semiconductor device, 13 semiconductor element, 14 main terminal, 15 control terminal, 17 transfer mold resin, 32 electrode terminal, 32c flexible portion, 33 dam bar, 34 protruding portion, 34a, 34b extending portion, 36 part, 41 upper mold, 42a upper-mold parting surface, 42c terminal hole, 42e inner surface, 42f, 42h recessed portion, 61 lower mold, 71 movable clamp, 73 resin.

The invention claimed is:

1. A method of manufacturing a semiconductor device, the method comprising the steps of:
 (a) preparing a structure comprising a semiconductor element, a plurality of electrode terminals that are electrically coupled to the semiconductor element and are arrayed, and a dam bar for connecting the plurality of electrode terminals;
 (b) arranging a part of the structure comprising a part of the plurality of electrode terminals and the dam bar into a terminal hole being formed in a pair of molds and communicating with an internal space that is capable of being enclosed by the pair of molds, and accommodating a remaining part other than the part of the structure in the internal space of the pair of molds;
 (c) clamping the part of the structure with a movable clamp inside the terminal hole, and fitting at least a portion of the movable clamp into the terminal hole from a side opposite to the internal space with respect to the terminal hole; and
 (d) injecting a resin into the internal space of the pair of molds after the step (c).

2. The method of manufacturing a semiconductor device according to claim 1, wherein:
 the part of the structure further comprises a protruding portion that is formed in an end of an array of the plurality of electrode terminals and protrudes in an arraying direction of the plurality of electrode terminals; and
 the part of the structure is arranged into the terminal hole so that an inner surface of the terminal hole and the protruding portion come close to each other in the step (b).

3. The method of manufacturing a semiconductor device according to claim 1, wherein the plurality of electrode terminals are connected by a plurality of the dam bars in a plurality of rows.

4. The method of manufacturing a semiconductor device according to claim 1, wherein a flexible portion having flexibility is formed in a portion of the plurality of electrode terminals on a side of the semiconductor element with respect to a portion that is clamped by the movable clamp.

5. The method of manufacturing a semiconductor device according to claim 2, wherein an extending portion that extends along the inner surface of the terminal hole is formed in a distal end of the protruding portion in the step (b).

6. The method of manufacturing a semiconductor device according to claim 5, wherein the extending portion extends toward at least one of a direction from the distal end of the protruding portion toward the semiconductor element and a direction opposite to the direction.

7. The method of manufacturing a semiconductor device according to claim 1, wherein the terminal hole is formed in one of the pair of molds and opens in a vertical direction with respect to a parting surface of the pair of molds.

8. The method of manufacturing a semiconductor device according to claim 1, wherein:
 a shape of the part of the structure comprises a flat-plate-like shape; and
 the movable clamp clamps the part of the structure from both sides in a thickness direction thereof in the step (c).

9. The method of manufacturing a semiconductor device according to claim 1, wherein a force for fitting the movable clamp into the terminal hole in the step (c) is utilized as a force for clamping the part of the structure with the movable clamp in the step (c).

10. The method of manufacturing a semiconductor device according to claim 1, wherein a force for clamping the part of the structure with the movable clamp is generated in the step (c) from a force of a pressing machine for making the pair of molds come into contact to each other and separated from each other.

11. The method of manufacturing a semiconductor device according to claim 1, wherein a pressure of clamping the part of the structure with the movable clamp in the step (c) is larger than a pressure of injecting the resin in the step (d).

12. The method of manufacturing a semiconductor device according to claim 1, wherein:

in a case where the movable clamp is fitted into the terminal hole in the step (c), a recessed portion is formed, which has an inner surface of the terminal hole where the plurality of electrode terminals are arranged as a lateral portion and a distal end portion of the movable clamp as a bottom portion; and the resin is injected being in contact with the recessed portion in the step (d).

13. The method of manufacturing a semiconductor device according to claim 1, wherein:

a plurality of the terminal holes in which a plurality of the parts of the structures are to be respectively arranged are formed in the pair of molds so as to communicate with the internal space;

at least one of a recessed portion and a protruding portion is formed in, out of surfaces of the pair of molds, a surface between two adjacent the terminal holes on a side of the internal space; and the resin is injected being in contact with the at least one of the recessed portion and the protruding portion in the step (d).

14. A method of manufacturing a semiconductor device, the method comprising the steps of:

(a) preparing a structure comprising a semiconductor element, a plurality of electrode terminals that are electrically coupled to the semiconductor element and are arrayed, and a dam bar for connecting the plurality of electrode terminals;

(b) arranging a part of the structure comprising a part of the plurality of electrode terminals and the dam bar into a terminal hole being formed in a pair of molds and communicating with an internal space that is capable of being enclosed by the pair of molds, and accommodating a remaining part other than the part of the structure in the internal space of the pair of molds;

(c) clamping the part of the structure with a movable clamp inside the terminal hole, and fitting at least a portion of the movable clamp into the terminal hole; and (d) injecting a resin into the internal space of the pair of molds after the step (c), wherein:

the part of the structure further comprises a protruding portion that is formed in an end of an array of the plurality of electrode terminals and protrudes in an arraying direction of the plurality of electrode terminals; and the part of the structure is arranged into the terminal hole so that an inner surface of the terminal hole and the protruding portion come close to each other in the step (b), such that a position of an edge of the protruding portion of the structure facing the internal space is approximately in alignment in the arraying direction with a position of an edge of the dam bar facing the internal space.

15. A method of manufacturing a semiconductor device, the method comprising the steps of:

(a) preparing a structure comprising a semiconductor element, a plurality of electrode terminals that are electrically coupled to the semiconductor element and are arrayed, and a dam bar for connecting the plurality of electrode terminals;

(b) arranging a part of the structure comprising a part of the plurality of electrode terminals and the dam bar into a terminal hole being formed in a pair of molds and communicating with an internal space that is capable of being enclosed by the pair of molds, and accommodating a remaining part other than the part of the structure in the internal space of the pair of molds;

(c) clamping the part of the structure with a movable clamp inside the terminal hole, and fitting at least a portion of the movable clamp into the terminal hole; and (d) injecting a resin into the internal space of the pair of molds after the step (c), wherein:

a shape of the part of the structure comprises a flat-plate-like shape; and the movable clamp clamps the part of the structure from both sides in a thickness direction thereof in the step (c).

16. A method of manufacturing a semiconductor device, the method comprising the steps of:

(a) preparing a structure comprising a semiconductor element, a plurality of electrode terminals that are electrically coupled to the semiconductor element and are arrayed, and a dam bar for connecting the plurality of electrode terminals;

(b) arranging a part of the structure comprising a part of the plurality of electrode terminals and the dam bar into a terminal hole being formed in a pair of molds and communicating with an internal space that is capable of being enclosed by the pair of molds, and accommodating a remaining part other than the part of the structure in the internal space of the pair of molds;

(c) clamping the part of the structure with a movable clamp inside the terminal hole, and fitting at least a portion of the movable clamp into the terminal hole; and (d) injecting a resin into the internal space of the pair of molds after the step (c), wherein:

in a case where the movable clamp is fitted into the terminal hole in the step (c), a recessed portion is formed, which has an inner surface of the terminal hole where the plurality of electrode terminals are arranged as a lateral portion and a distal end portion of the movable clamp as a bottom portion; and the resin is injected being in contact with the recessed portion in the step (d).

* * * * *